United States Patent
Nam et al.

(10) Patent No.: US 10,284,826 B2
(45) Date of Patent: May 7, 2019

(54) IMAGE SENSOR AND APPARATUS AND METHOD OF ACQUIRING IMAGE BY USING IMAGE SENSOR

(71) Applicant: SAMSUNG ELECTRONICS CO., LTD., Suwon-si (KR)

(72) Inventors: Sunghyun Nam, Yongin-si (KR); Yunhee Kim, Seoul (KR); Sookyoung Roh, Seoul (KR); Hongkyu Park, Yongin-si (KR); Seokho Yun, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 15/695,546

(22) Filed: Sep. 5, 2017

(65) Prior Publication Data

US 2017/0366787 A1 Dec. 21, 2017

Related U.S. Application Data

(62) Division of application No. 14/952,342, filed on Nov. 25, 2015, now Pat. No. 9,787,953.

(30) Foreign Application Priority Data

Nov. 27, 2014 (KR) .................. 10-2014-0167816

(51) Int. Cl.
  *H04N 5/33* (2006.01)
  *H04N 9/04* (2006.01)
  *H01L 27/146* (2006.01)

(52) U.S. Cl.
  CPC ....... *H04N 9/045* (2013.01); *H01L 27/14621* (2013.01); *H01L 27/14625* (2013.01); *H04N 5/33* (2013.01)

(58) Field of Classification Search
  CPC ........ H01L 27/14621; H01L 27/14625; H04N 5/33; H04N 9/045; H04N 5/332
  See application file for complete search history.

(56) References Cited

U.S. PATENT DOCUMENTS 5,642,214 A * 6/1997 Ishii .................... G02F 1/13473
  349/117
2006/0237751 A1* 10/2006 Morimoto ......... H01L 27/14623
  257/232

(Continued)

FOREIGN PATENT DOCUMENTS

| JP | 2006-190958 A | 7/2006 |
| KR | 10-2008-0095054 A | 10/2008 |
| KR | 10-2012-0115888 A | 10/2012 |

OTHER PUBLICATIONS

Office Action issued in U.S. Appl. No. 14/952,342 dated Feb. 22, 2017.

(Continued)

*Primary Examiner* — Timothy J Henn
(74) *Attorney, Agent, or Firm* — Sughrue Mion, PLLC

(57) ABSTRACT

An image sensor, and an apparatus and method of acquiring an image by using the image sensor are provided. The image sensor includes a color filter having an array of a plurality of types of color filter elements, where each of the color filter elements transmits visible light in a certain wavelength band and blocks visible light outside the certain wavelength band; a photoelectric conversion cell array that detects light that has been transmitted through the color filter; and a modulator, disposed on the photoelectric conversion cell array, which changes a rate of light transmitted to the photoelectric conversion cell array based on an applied voltage.

8 Claims, 5 Drawing Sheets

(56) References Cited

U.S. PATENT DOCUMENTS

| | | | |
|---|---|---|---|
| 2010/0182496 A1* | 7/2010 | Brady | G02B 26/02 348/362 |
| 2012/0025061 A1* | 2/2012 | Izuha | H01L 27/14621 250/208.1 |
| 2012/0129269 A1* | 5/2012 | Choi | A61B 5/0075 436/164 |
| 2012/0162380 A1* | 6/2012 | Cho | B82Y 20/00 348/47 |
| 2013/0016188 A1* | 1/2013 | Ogasahara | H04N 5/2355 348/49 |
| 2013/0050809 A1* | 2/2013 | Han | C09C 1/3676 359/321 |
| 2013/0240714 A1 | 9/2013 | Higashitsutsumi et al. | |
| 2013/0258112 A1 | 10/2013 | Baksht | |
| 2014/0078310 A1* | 3/2014 | Velichko | H04N 5/33 348/164 |
| 2014/0285627 A1* | 9/2014 | Kuboi | H04N 5/2353 348/46 |
| 2014/0354999 A1* | 12/2014 | Englund | G01J 3/26 356/456 |
| 2015/0061062 A1* | 3/2015 | Lin | H01L 27/14643 257/432 |
| 2015/0168747 A1 | 6/2015 | Kadono et al. | |
| 2015/0172564 A1* | 6/2015 | Fan | G02B 26/007 348/164 |
| 2015/0304638 A1 | 10/2015 | Cho et al. | |
| 2015/0365609 A1 | 12/2015 | Mine | |
| 2016/0018676 A1 | 1/2016 | Park et al. | |
| 2016/0315115 A1* | 10/2016 | Izuha | H04N 9/045 |
| 2017/0085765 A1* | 3/2017 | Choi | G02F 1/13318 |
| 2017/0140221 A1* | 5/2017 | Ollila | G06K 9/00604 |

OTHER PUBLICATIONS

Notice of Allowance issued in U.S. Appl. No. 14/952,342 dated Jun. 5, 2017.

\* cited by examiner

IMAGE SENSOR AND APPARATUS AND METHOD OF ACQUIRING IMAGE BY USING IMAGE SENSOR

RELATED APPLICATION

This is a divisional application of U.S. application Ser. No. 14/952,342 filed on Nov. 25, 2015, which claims priority from Korean Patent Application No. 10-2014-0167816, filed on Nov. 27, 2014 in the Korean Intellectual Property Office, the disclosures of which are incorporated herein in their entirety by reference.

BACKGROUND

1. Field

Apparatuses and methods consistent with exemplary embodiments relate to an image sensor and an apparatus and method of acquiring an image by using the image sensor, and more particularly, to an image sensor that is capable of acquiring not only a visible light image but also an infrared image and an apparatus and method of acquiring an image by using the image sensor.

2. Description of the Related Art

An image sensor may acquire a visible light image, made up of only visible light, by using an infrared elimination filter separate from the image sensor. Likewise, an image sensor may acquire an infrared image, made up of only infrared light, by using a visible light elimination filter, also separate from the image sensor. In order for an image sensor to simultaneously acquire a visible light image and an infrared image, both visible light color pixels and infrared pixels are used. In this case, a visible light color filter, which transmits visible light, may be used in conjunction with the visible light color pixels and an infrared filter, which transmits infrared light, may be used in conjunction with the infrared pixels.

however, when infrared pixels are used in conjunction with color pixels, the resolution and sensitivity of both the visible light image and the infrared image may be low. Also, it may not be easy to form a dye filter or a stacked film filter which both blocks visible light and has the desired infrared ray transmission properties.

SUMMARY

One or more exemplary embodiments may provide an image sensor that is capable of acquiring both an infrared image and a visible light image, without decreasing image resolution, by not using separate infrared pixels, and an apparatus and method of acquiring an image by using the image sensor.

Additional exemplary aspects and advantages will be set forth in part in the description which follows and, in part, will be apparent from the description, or may be learned by practice of the presented exemplary embodiments.

According to an aspect of an exemplary embodiment, an image sensor includes a color filter comprising a plurality of types of color filter elements arranged in an array, where each of the color filter elements transmits visible light in a certain wavelength band, and blocks visible light outside the certain wavelength band, a photoelectric conversion cell array that detects light that has been transmitted through the color filter, and a modulator that is disposed on an upper portion or a lower portion of the photoelectric conversion cell array and changes a rate of light transmitted to the photoelectric conversion cell array according to an applied voltage.

The modulator may be a reflective modulator disposed on the lower portion of the photoelectric conversion cell array and has a light reflectivity that changes according to the applied voltage.

The reflective modulator may include an active modulation layer having a reflectivity that is adjustable by application of a voltage, a first electrode located at a first side of the active modulation layer, and a second electrode located at a second side of the active modulation layer.

The active modulation layer may be configured such that a reflectivity of light in an infrared wavelength band changes according to the applied voltage.

The active modulation layer may be configured such that a reflectivity of light in a visible wavelength band is 10% or less.

The active modulation layer may include a chalcogenide material.

The active modulation layer may comprise at least one dielectric thin film layer and a layer that has properties that change according to the voltage.

The active modulation layer may be configured such that a reflectivity of light in a visible wavelength band changes according to the applied voltage.

The modulator may be a transmissive modulator that is located on the upper portion of the photoelectric conversion cell array and has a light transmittance that changes according to the applied voltage.

The modulator may be configured such that light in one of an infrared wavelength band and a visible wavelength band is transmitted and a transmittance of light in a remaining wavelength band changes according to the applied voltage.

The photoelectric conversion cell array may comprise a photoelectric conversion layer, and each of the photoelectric conversion cells of the photoelectric conversion cell array may be separated from adjacent photoelectric conversion cells by a trench formed in the photoelectric conversion layer.

According to an aspect of another exemplary embodiment, an apparatus for acquiring an image includes an image sensor including a color filter comprising a plurality of types of color filter elements arranged as an array, where each of the color filter elements transmits visible light in a certain wavelength band, and blocks visible light in other wavelength bands; a photoelectric conversion cell array that detects light that has been transmitted through the color filter; and a modulator that is disposed on an upper portion or a lower portion of the photoelectric conversion cell array and changes a rate of light transmitted to the photoelectric conversion cell array according to an applied voltage; a driver which turns on and off a voltage applied to the modulator; and a signal processor which calculates a visible light image and an infrared image by using a first image obtained by the image sensor when the voltage is not applied to the modulator and a second image obtained by the image sensor when the voltage is applied to the modulator.

When the first image is I(1) and the second image is I(2), the infrared image may be obtained by calculating I(2)−I(1), and the visible light image may be obtained by subtracting the infrared image from the first image I(1).

The modulator may be disposed on the lower portion of the photoelectric conversion cell array and may have a reflectivity of light in an infrared wavelength band which changes according to the applied voltage. The visible light image may be obtained by calculating $I(1)-((I(2)-I(1))*k$ (where $k=IR(T)/IR(R)$) when $IR(T)$ indicates an image of infrared light that is transmitted through the color filter, travels toward the photoelectric conversion cell array, and is absorbed and detected by the photoelectric conversion cell array, and $IR(R)$ indicates an image of infrared light that is reflected by the modulator when the voltage is applied to the modulator, travels toward the photoelectric conversion cell array, and is absorbed and detected by the photoelectric conversion cell array.

The modulator may include an active modulation layer having a reflectivity that is adjustable by applying a voltage, a first electrode located at a first side of the active modulation layer, and a second electrode located at a second side of the active modulation layer. The active modulation layer may include a material having a reflectivity of light in an infrared wavelength band which changes according to the applied voltage.

The active modulation layer may be configured such that a reflectivity of light in a visible wavelength band is 10% or less.

The active modulation layer may include a chalcogenide material.

The active modulation layer may comprise at least one dielectric thin film layer and a layer that has properties that change according to the applied voltage.

When the first image is $I(1)$ and the second image is $I(2)$, the visible light image may be obtained by calculating $I(2)-I(1)$, and the infrared image may be obtained by removing the visible light image from the first image $I(1)$.

The modulator may be disposed on the lower portion of the photoelectric conversion cell array and may have a reflectivity of light in a visible wavelength band which changes according to the applied voltage. The infrared image may be obtained by calculating $I(1)-((I(2)-I(1))*k$ (where $k=A(T)/A(R)$) when $A(T)$ is an image of visible light that passes through the color filter, travels toward the photoelectric conversion cell array, and is absorbed and detected by the photoelectric conversion cell array, and $A(R)$ is an image of visible light that is reflected by the modulator when the voltage is applied to the modulator, travels toward the photoelectric conversion cell array, and is absorbed and detected by the photoelectric conversion cell array.

The photoelectric conversion cell array may comprise a photoelectric conversion layer, and each of the photoelectric conversion cells of the photoelectric conversion cell array may be separated from adjacent photoelectric conversion cells by a trench formed in the photoelectric conversion layer.

According to an aspect of another exemplary embodiment, a method of acquiring an image by using an image sensor including a color filter comprising a plurality of types of color filter elements arranged as an array, where each of the color filter elements transmits visible light in a certain wavelength band, and blocks visible light in other wavelength bands; a photoelectric conversion cell array that detects light that has been transmitted through the color filter; and a modulator that is disposed on an upper portion or a lower portion of the photoelectric conversion cell array and changes a rate of light transmitted to the photoelectric conversion cell array by an applied voltage, the method includes the image sensor obtaining a first image $I(1)$ when a voltage is not applied to the modulator, the image sensor obtaining a second image $I(2)$ when the voltage is applied to the modulator, obtaining any one image selected from an infrared image and a visible light image by using the second image $I(2)$ and the first image $I(1)$, and obtaining the other image selected from the infrared image and the visible light image by subtracting the any one image from the first image $I(1)$.

The any one image may be obtained by using a difference between the second image $I(2)$ and the first image $I(1)$.

The any one image may be an infrared image and the other image may be a visible light image. The method may further include obtaining $k=IR(T)/IR(R)$, wherein $IR(T)$ is an image of infrared light that passes through the color filter, travels toward the photoelectric conversion cell array, and is absorbed and detected by the photoelectric conversion cell array, and $IR(R)$ is an image of infrared light that is reflected by the modulator, travels toward the photoelectric conversion cell array, and is absorbed and detected by the photoelectric conversion cell array. The visible light image may be obtained by calculating $I(1)-((I(2)-I(1))*k$.

The any one image may be a visible light image and the other image may be an infrared image. The method may further include obtaining $k=A(T)/A(R)$, wherein $A(T)$ is an image of visible light that passes through the color filter, travels toward the photoelectric conversion cell array, and is absorbed and detected by the photoelectric conversion cell array, and $A(R)$ is an image of visible light that is reflected by the modulator, travel toward the photoelectric conversion cell array, and absorbed and detected by the photoelectric conversion cell array. The infrared image may be obtained by calculating $I(1)-((I(2)-I(1))*k$.

An image sensor, and apparatus and method of acquiring an image according to one or more exemplary embodiments may have a resolution and a sensitivity of the visible light image which are not decreased and a resolution of an infrared image which is also not decreased because there is no additional use of infrared image sensing pixels. Also, a separate infrared light elimination filter for detecting the visible light image and a visible light elimination filter for detecting the infrared image may be unnecessary according to one or more of the exemplary embodiments.

BRIEF DESCRIPTION OF THE DRAWINGS

These and/or other exemplary aspects and advantages will become apparent and more readily appreciated from the following description of exemplary embodiments, taken in conjunction with the accompanying drawings in which.

DETAILED DESCRIPTION

Figure 1:
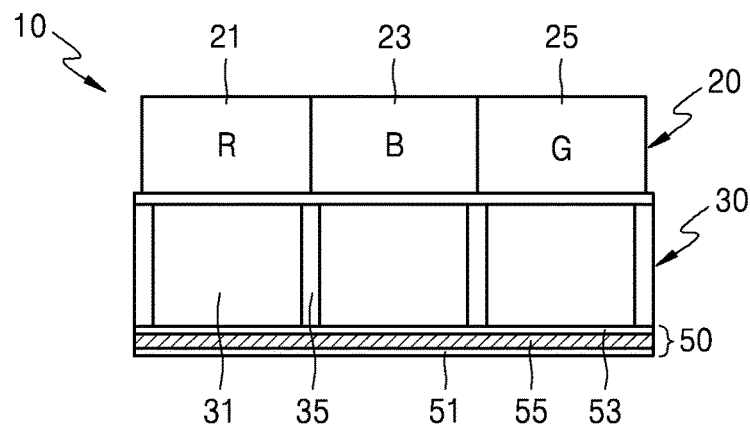
FIG. 1 schematically illustrates an image sensor according to an exemplary embodiment.

An image sensor and an apparatus and method of acquiring an image by using the image sensor will be described in detail with reference to the accompanying drawings. In the drawings, like reference numerals refer to like elements throughout, and the thicknesses of layers and regions are exaggerated for clarity. In addition, exemplary embodiments are merely described below, and various modifications may be made to the exemplary embodiments. It will be understood that when a layer is referred to as being "formed on" or "on" another layer, it can be directly or indirectly formed on the other layer. Expressions such as "at least one of," when preceding a list of elements, modify the entire list of elements and do not modify the individual elements of the list.

An image sensor according to an exemplary embodiment includes a color filter including a plurality of types of color filter elements that are arranged in an array. Each of the color filter elements transmits visible light in a certain wavelength band and blocks visible light in other wavelength bands. The image sensor also includes a photoelectric conversion cell array that detects light that has been transmitted through the color filter and a modulator that is disposed above or below the photoelectric conversion cell array and changes a rate of light transmitted to the photoelectric conversion cell array according to an applied voltage. When the modulator is located below the photoelectric conversion cell array, the modulator is a reflective modulator. When the modulator is located above the photoelectric conversion cell array, the modulator is a transmissive modulator. With respect to an orientation photoelectric conversion cell array, it is intended that light is incident toward the image sensor from above the image sensor.

FIG. 1 schematically illustrates an image sensor 10 according to an exemplary embodiment. The modulator illustrated in FIG. 1 is a reflective modulator.

Referring to FIG. 1, the image sensor 10 includes a color filter 20 including a plurality of types of color filter elements, for example, a red (R) color filter element 21, a blue (B) color filter element 23, and a green (G) color filter element 25 that are arranged in an array; a photoelectric conversion cell array 30 that detects light that has passed through the color filter 20, and a reflective modulator 50 located below the photoelectric conversion cell array 30.

The color filter 20 is formed by arranging the plurality of types of color filter elements in a 2-dimensional (2D) array of pixel units. Each of the color filter elements corresponds to a single color pixel of the image sensor 10. For example, when the color filter 20 includes a 2D array including the R color filter elements 21, the B color filter elements 23, and the G color filter elements 25, the image sensor 10 includes a 2D array of an R color pixel, a B color pixel, and a G color pixel.

FIG. 1 illustrates an example in which the color filter 20 includes R color filter elements 21, B color filter elements 23, and G color filter elements 25, and the image sensor 10 includes R color pixels, B color pixels, and G color pixels corresponding thereto. It is noted that only one of each of the R, G, and B color filters, and only one each of the R, G, and B color pixels is illustrated in FIG. 1. However, compositions and dispositions of the color filter elements of the color filter 20 and those of the R, B, and G color pixels of the image sensor 10 that correspond thereto may be modified in any of various ways.

Figure 2A:
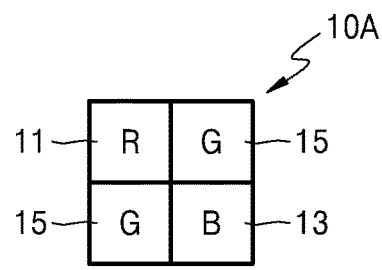
FIGS. 2A and 2B illustrate exemplary embodiments of basic units of color pixels of an image sensor.
Figure 2B:
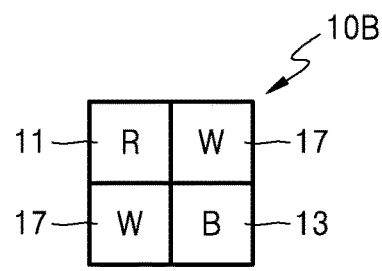

FIGS. 2A and 2B illustrate exemplary embodiments of basic units 10a and 10b of color pixels of the image sensor 10.

Referring to FIG. 2A, a basic unit 10a of color pixels of the image sensor 10 may include, for example, four color pixels including an R color pixel 11, two G color pixels 15, and a B color pixel 13. A plurality of these basic units 10a, each including the four color pixels, may be 2-dimensionally arranged in an array. Each of the color pixels of the image sensor 10 and each of the color filter elements of the color filter 20 may correspond to each other, one-on-one. The image sensor 10 may be an RGB color sensor in which four color pixels form a basic unit.

Referring to FIG. 2B, a basic unit 10b of color pixels of the image sensor 10 may include, for example, four color pixels including an R color pixel 11, two white (W) color pixels 17, and a B color pixel 13. A plurality of the basic units 10b, each including the four color pixels, may be 2-dimensionally arranged. In this case, each of the color pixels of the image sensor 10 and each of the color filter elements of the color filter 20 may correspond to each other, one-to-one, and thus, the image sensor 10 may also have four color pixels as a basic unit. Also, when the basic unit 10b of the color pixels of the image sensor 10 includes the R color pixel 11, the two white (W) color pixels 17, and the B color pixel 13, an image of the R color pixel, an image of the white W color pixels, and an image of the B color pixel may be detected, and a visible light image of a required color may be calculated based on the images. Therefore, an example in which the image sensor 10 is an RGB color sensor will be described below.

Referring back to FIG. 1, in the photoelectric conversion cell array 30, a plurality of photoelectric conversion cells 31 may be 2-dimensionally arranged to detect light that has passed though the color filter 20. Each of the photoelectric conversion cells 31 of the photoelectric conversion cell array 30 may correspond to one of the R, B, and G color filter elements 21, 23, and 25, and may detect light that has passed through the corresponding R, B, or G color filter element 21, 23, or 25. The photoelectric conversion cells 31 that correspond to the R, B, and G color filter elements 21, 23, and 25 are included in the color pixels of the image sensor 10.

For example, the photoelectric conversion cell array 30 may be formed by using photoelectric conversion layers. Each of the photoelectric conversion cells 31 of the photoelectric conversion cell array 30 may be separated from adjacent photoelectric conversion cells 31 by a trench 35 formed in the photoelectric conversion layers.

In the image sensor 10 according to an exemplary embodiment, the photoelectric conversion cell array 30 may have a high photoelectric conversion rate with respect to visible light so that a visible light image is detected. Accordingly, when the photoelectric conversion rate is high with respect to the visible light, the photoelectric conversion rate with respect to infrared light is comparatively low.

Therefore, of the light that passes through the color filter 20 and is incident on the photoelectric conversion cell array 30, infrared light included therein may not be completely absorbed but rather only partially absorbed by the photoelectric conversion cells 31 and partially transmitted through the photoelectric conversion cells 31.

The reflective modulator 50 may be provided such that light reflectivity, in particular, infrared light reflectivity, changes according to an applied voltage. In this case, the reflective modulator 50 may reflect the infrared light that has passed through the photoelectric conversion cells 31 back to the photoelectric conversion cells 31 so that the infrared light is again incident on the photoelectric conversion cells 31 and can be detected by the photoelectric conversion cells 31.

Figure 3A:
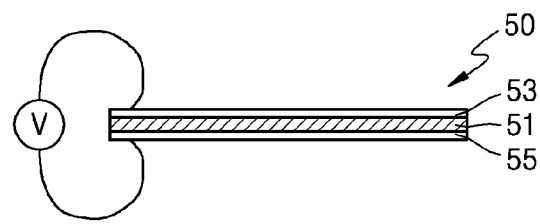
FIG. 3A illustrates an example of a structure of a reflective modulator of FIG. 1.
Figure 3B:
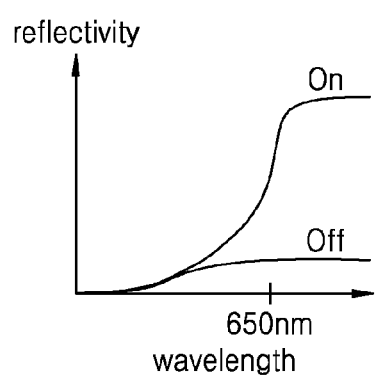
FIG. 3B illustrates a reflectivity change of the reflective modulator of FIG. 3A when a voltage is turned on and off.

FIG. 3A illustrates an example of a structure of the reflective modulator 50 of FIG. 1. FIG. 3B illustrates a change in the reflectivity of the reflective modulator of FIG. 3A when a voltage is turned on and off. The reflective modulator 50 may be configured by one of skill in the art such that its reflectivity is adjusted by applying a voltage and such that its reflectivity in an infrared light spectrum changes as shown in FIG. 3B when the voltage is turned on and off.

Referring to FIG. 3A, the reflective modulator 50 may include an active modulation layer 51, having a reflectivity which is adjustable by application of a voltage, a first electrode 53 located at a first side of the active modulation layer 51, and a second electrode 55 located at a second side of the active modulation layer 51, opposite the first side.

The active modulation layer 51 may be configured such that the reflectivity of light in an infrared wavelength band changes according to the applied voltage. In this case, the active modulation layer 51 may be configured such that the reflectivity of light in a visible wavelength band is, for example, about 10% or less. The active modulation layer 51 may include a phase change material, for example, chalcogenide.

For example, the active modulation layer 51 may be formed by combining at least one dielectric thin film layer and a layer that has properties that change based on application of a voltage, so that the reflectivity of light in the infrared wavelength band changes according to whether the voltage is turned on or off.

As shown in FIG. 3B, when the voltage is turned off, the reflective modulator 50, configured as described above, may have a low overall reflectivity and also have a low reflectivity in the infrared wavelength band. However, when the voltage is turned on, the reflectivity of light in the infrared wavelength band may be very high as compared to when the voltage is turned off.

Therefore, when the voltage applied to the reflective modulator 50 is turned on and off, the infrared light reflected by the reflective modulator 50 is also, effectively, turned on and off. When the voltage is turned on, infrared light reflected by the reflective modulator 50 may be incident again on the photoelectric conversion cells 31 and detected by the photoelectric conversion cells 31. Thus, a total amount of infrared light detected by the photoelectric conversion cells 31 may be greater when the voltage is turned on than when the voltage is turned off.

Figure 4:
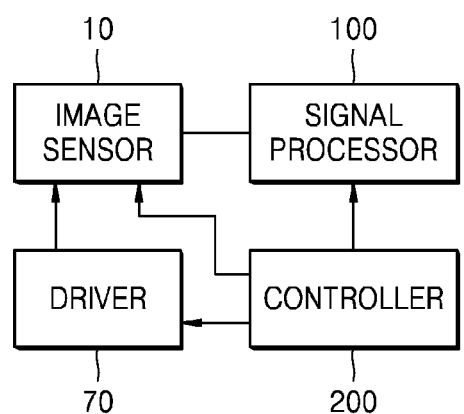
FIG. 4 is a block diagram schematically illustrating an apparatus for acquiring an image by using an image sensor, according to an exemplary embodiment.

FIG. 4 is a block diagram schematically illustrating an apparatus for acquiring an image by using the image sensor 10, according to an exemplary embodiment.

Referring to FIG. 4, the apparatus for acquiring the image includes the image sensor 1, a driver 70, and a signal processor 100. The image sensor 10, the driver 70, and the signal processor 100 may be controlled by a controller 200. As described with reference to FIG. 1, the image sensor 10 may include the color filter 20, the photoelectric conversion cell array 30, and the reflective modulator 50. The driver 70 may turn on and off the voltage applied to the reflective modulator 50 of the image sensor 10. The signal processor 100 may create a visible light image and an infrared image using an image signal obtained by the image sensor 10 when the voltage of the reflective modulator 50 is turned on and off. In order to obtain the visible light image and the infrared image in the apparatus for acquiring the image according to the present exemplary embodiment, an image is captured once when the voltage applied to the reflective modulator 50 is turned on and again when the voltage applied to the reflective modulator is turned off.

Figure 5A:
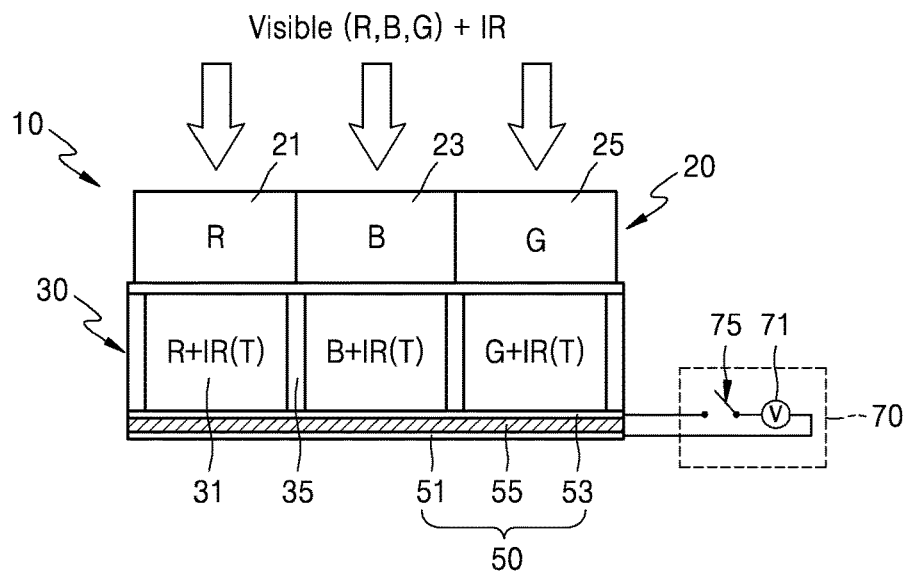
FIG. 5A illustrates detection of an image by each photoelectric conversion cell of a photoelectric conversion cell array when a switch of a driver is open so that a voltage is not applied to a reflective modulator, according to an exemplary embodiment.
Figure 5B:
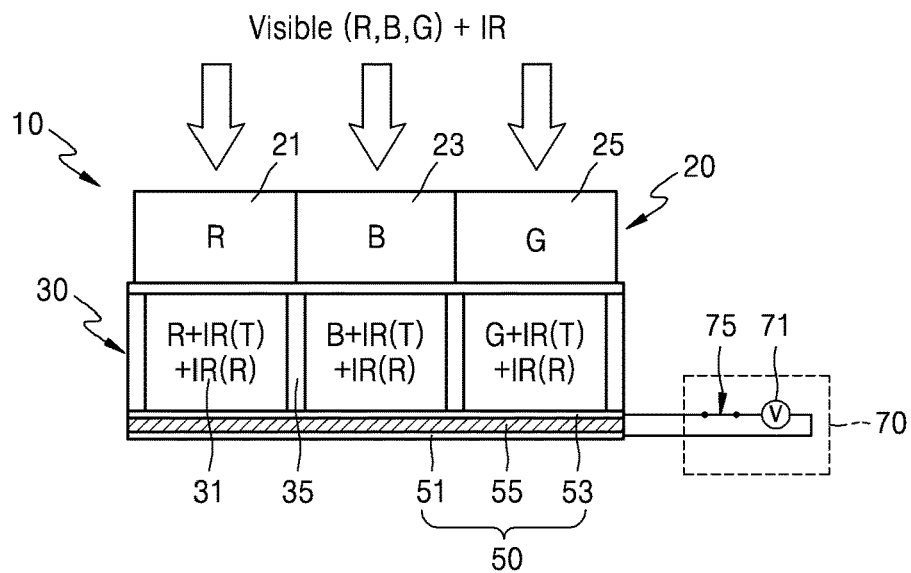
FIG. 5B illustrates detection of an image by each photoelectric conversion cell of a photoelectric conversion cell array when a switch of a driver is connected so that a voltage is applied to a reflective modulator, according to an exemplary embodiment.

As shown in FIGS. 5A and 5B, the driver 70 may include a power source 71 that applies a voltage and a switch 75 that turns on and off the voltage from the power source 71 as applied to the reflective modulator 50.

The signal processor 100 may create a visible light image and an infrared image by using a first image I(1) obtained by the image sensor 10 when the voltage is not applied to the reflective modulator 50 and a second image I(2) obtained by the image sensor 10 when the voltage is applied to the reflective modulator 50.

FIG. 5A illustrates detection of an image by each of the photoelectric conversion cells 31 of the photoelectric conversion cell array 30 when the switch 75 of the driver 75 is open so that the voltage is not applied to the reflective modulator 50. FIG. 5B illustrates detection of an image by each of the photoelectric conversion cells 31 of the photoelectric conversion cell array 30 when the switch 75 of the driver 70 is connected so that the voltage is applied to the reflective modulator 50.

Light, in which the visible light (visible (R,B,G)) and the infrared light (IR) are mixed, is incident on the image sensor 10. The infrared light (IR) is mixed with the red light, blue light, and green light, which respectively pass through the R color filter element 21, the B color filter element 23, and the G color filter element 25, and then are incident on the photoelectric conversion cells 31 that respectively correspond to the R, B, and G color filter elements 21, 23, and 25.

Assuming that IR(T) indicates images of infrared light that passes through the R, B, and G color filter elements 21, 23, and 25 of the color filter 20 and is incident on and detected by the photoelectric conversion cell array 30, and that R, B, and G respectively indicate detected images of red light, blue light, and green light, then, R+IR(T), B+IR(T), and G+IR(T) may indicate first images I(1) detected by the photoelectric conversion cells 31 (which correspond to the R, B, and G color pixels of the image sensor 10) when the voltage is not applied to the reflective modulator 50, as shown in FIG. 5A. Although infrared images IR(T) of the first images I(1) detected by the photoelectric conversion cells 31 that correspond to the R, B, and G color pixels may be different from each other, since an infrared image and a visible light image are calculated for each of the R, B, and G color pixels of the image sensor 10, the infrared images IR(T) are indicated by using a single reference numeral for convenience.

When the voltage is applied to the reflective modulator 50, of the infrared light that has passed through the R, G, and B color filter elements 21, 23, and 25 and is incident on the photoelectric conversion cells 31, infrared light that is not absorbed but has passed through the photoelectric conversion cells 31 is reflected by the reflective modulator 50 and is incident again on the photoelectric conversion cell array 30. As shown in FIG. 5B, assuming that an image of the absorbed and detected infrared light is referred to as IR(R), second images I(2) detected by the photoelectric conversion cells 31 (which correspond to the R, B, and G color pixels of the image sensor 10) may be respectively represented as R+IR(T)+IR(R), B+IR(T)+IR(R), and G+IR(T)+IR(R). Both when the voltage is applied and when it is not applied to the reflective modulator 50, the visible light reflectivity of the reflective modulator 50 may be almost zero. Also, when the voltage is not applied to the reflective modulator 50, the infrared light reflectivity of the reflective modulator 50 may be almost zero. Although infrared images IR(T) and IR(R) of the second images I(2), detected by the photoelectric conversion cells 31 that correspond to the R, B, and G color pixels, may be different from each other, since an infrared image and a visible light image are calculated for each of the R, B, and G color pixels of the image sensor 10, the infrared images IR(T) and IR(R) are indicated by using a single reference numeral for convenience.

Therefore, an infrared image may be obtained by subtracting a first image I(1), obtained when the voltage is not applied to the reflective modulator 50, from a second image I(2), obtained when the voltage is applied to the reflective modulator 50. That is, images detected by the photoelectric conversion cells 31 satisfy: I(2)−I(1)=R+IR(T)+IR(R)−(R+IR(T))=IR(R), I(2)−I(1)=B+IR(T)+IR(R)−(B+IR(T))=IR(R), and I(2)−I(1)=G+IR(T)+IR(R)−(G+IR(T))=IR(R). Thus, only the infrared image IR(R) remains. Accordingly, the infrared image may be obtained from I(2)−I(1).

A visible light image may be calculated, for example, by removing the infrared image from the first image I(1). For example, k=IR(T)/IR(R) regarding the image sensor 10 may be obtained, and then, the visible light image may be obtained by using I(1)−(I(2)−I(1))*k. That is, I(1)−(I(2)−I(1))*k=I(1)−IR(R)*k=I(1)−IR(R)*IR(T)/IR(R)=I(1)−IR(T), and thus, only the visible light image remains.

k=IR(T)/IR(R) may be obtained b a calibration process for the image sensor 10. The values of k that are obtained in the calibration process may be stored as, for example, a lookup table. Then, visible light (R, B, and G) images may be calculated by applying values of k that match the infrared image IR(R) that is obtained from the first image I(1) and the second image I(2).

By using the apparatus for acquiring images as described above, the first image I(1) may be obtained by the image sensor 10 when the voltage is not applied to the reflective modulator 50, and the second image I(2) may be obtained by the image sensor 10 when the voltage is applied to the reflective modulator 50. Then, the infrared images may be obtained by using the second image I(2) and the first image I(1), and the visible light images may be obtained by removing the infrared images from the first image I(1).

According to the drawings and descriptions above, in the image sensor 10 according to an exemplary embodiment and the apparatus for acquiring an image by using the image sensor 10, a reflective modulator 50 is configured such that an infrared light reflectivity changes according to an applied voltage. However, the reflective modulator 50 may also be configured such that a visible light reflectivity changes according to the applied voltage. For example, the visible light, which passes through the color filter 20 and is incident on the photoelectric conversion cell array 30 of the image sensor 10 according to an exemplary embodiment, may not be completely absorbed but may be only partially absorbed by the photoelectric conversion cells 31 and may be partially transmitted through the photoelectric conversion cells 31. Therefore, when a reflective modulator 50 is configured such that the visible light reflectivity changes according to the applied voltage, the image sensor 10 according to an exemplary embodiment and the apparatus for acquiring an image by using the image sensor 10 may detect both a visible light image and an infrared image as described with reference to FIGS. 6A and 6B.

Figure 6A:
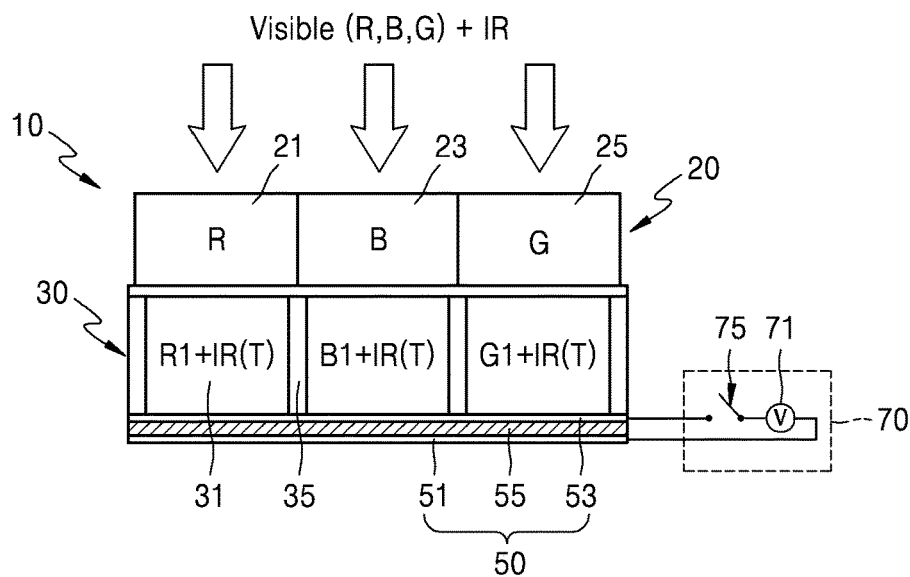
FIG. 6A illustrates detection of an image by each photoelectric conversion cell of a photoelectric conversion cell array when a voltage is not applied to a reflective modular, in a case in which a reflective modular is provided such that a visible light reflectivity changes according to an applied voltage, according to an exemplary embodiment.
Figure 6B:
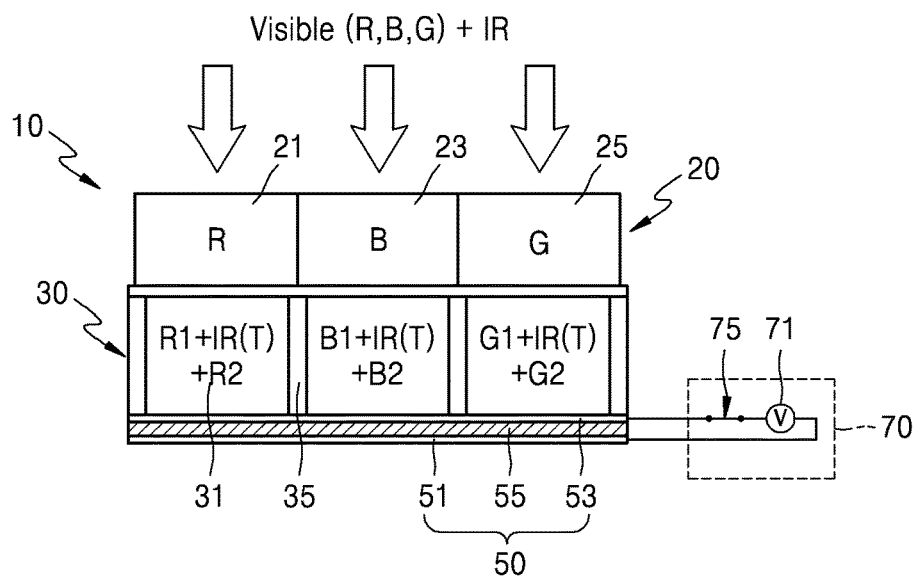
FIG. 6B illustrates detection of an image by each photoelectric conversion cell of a photoelectric conversion cell array when a voltage is applied to a reflective modular, in case in which a reflective modular is provided such that a visible light reflectivity changes according to an applied voltage, according to an exemplary embodiment.

FIGS. 6A and 6B illustrate detection of an image by each of the photoelectric conversion cells 31 of the photoelectric conversion cell array 30 when the reflective modulator 50 is configured such that a visible light reflectivity changes according to an applied voltage and a voltage is applied and not applied to the reflective modulator 50.

When the reflective modulator 50 is configured such that the visible light reflectivity changes according to the applied voltage, visible light that has passed through the photoelectric conversion cells 31 may be reflected by the reflective modulator 50, may be incident again on the photoelectric conversion cells 31, and may be detected by the photoelectric conversion cells 31.

For example, when the voltage applied to the reflective modulator 50 is turned on and off, visible light may be reflected and not reflected by the reflective modulator 50, respectively. When the voltage is applied, the visible light reflected by the reflective modulator 50 is again incident on the photoelectric conversion cells 31 and is detected by the photoelectric conversion cells 31. Accordingly, more visible light is detected by the photoelectric conversion cells 31 when the voltage is applied than when the voltage is not applied.

Therefore, when the reflective modulator 50 is configured such that the visible light reflectivity changes according to whether the voltage is or is not applied thereto, a visible light image and an infrared image may be calculated by using a first image I(1) obtained by the image sensor 10 when the voltage is not applied to the reflective modulator 50 and a second image I(2) obtained by the image sensor 10 when the voltage is applied to the reflective modulator 50.

For example, light, in which the visible light (Visible (R,B,G)) and the infrared light (IR) are mixed, is incident on the image sensor 10. The infrared light (IR) is mixed with the red light, blue light, and green light which respectively pass through the R color filter element 21, the B color filter element 23, and the G color filter element 25, and are then incident on the photoelectric conversion cells 31 that respectively correspond to the R, B, and G color filter elements 21, 23, and 25.

Referring to FIG. 6A, assuming that IR(T) indicates images of infrared light that passes though the R, B, and G color filter elements 21, 23, and 25 of the color filter 20 and are incident on and detected by the photoelectric conversion cell array 30, and assuming that R1, B1, and G1 respectively indicate detected images of red light, blue light, and green light, then, R1+IR(T), B1+IR(T), G1+IR(T) may indicate first images I(1) detected by the photoelectric conversion cells 31 (which correspond to the R, B, and G color pixels of the image sensor 10) when the voltage is not applied to the reflective modulator 50. Although infrared images IR(T) of the first images I(1) detected by the photoelectric conversion cells 31 that correspond to the R, B, and G color pixels may be different from each other, since an infrared image and a visible light image are calculated for each of the R, B, and G color pixels of the image sensor 10, the infrared images IR(T) are indicated by using a single reference numeral for convenience.

Referring to FIG. 6B, when the voltage is applied to the reflective modulator 50, from among the visible light that has passed through the R, B, and G color filter elements 21, 23, and 25 and incident on the photoelectric conversion cells 31, visible light that is not absorbed is reflected by the reflective modulator 50 and is again incident on the photoelectric conversion cell array 30. Assuming that images of absorbed an detected red, light, blue light, and green light are respectively referred to as R2, B2, and G2, second images I(2) of visible light of each color detected by the photoelectric conversion cells 31 (which correspond to the R, B, and G color pixels of the image sensor 10) may be respectively referred to as R1+IR(T)+R2, B1+IR(T)+B2, and G1+IR(T)+G2. In the case in which a reflective modulator 50 is configured such that a visible light reflectivity changes according to an applied voltage and an infrared light reflectivity is almost zero, the infrared light reflectivity of the reflective modulator 50 may be zero when the applied voltage is turned on and off, and the visible light reflectivity of the reflective modulator 50 may be zero when the voltage is not applied. Also, although infrared images IR(T) detected by the photoelectric conversion cells 31 that correspond to the R, B, and G color pixels may be different from each other, since an infrared image and a visible light image are calculated for each of the R, B, and G color pixels of the image sensor 10, the infrared images IR(T) are indicated by using a single reference numeral for convenience.

In the example described above, a visible light image may be obtained for each color pixel by subtracting a first image I(1) obtained when the voltage is not applied to the reflective modulator 50 from a second image I(2) obtained when the voltage is applied to the reflective modulator 50. That is, regarding images of red, blue, and green light detected by the photoelectric conversion cells 31, by subtracting the second image I(2) from the first image I(1): I(2)−I(1)=R1−IR(T)+R2−(R1+IR(T))=R2, I(2)−I(1)=B1+IR(T)+B2−(B1+IR(T))=B2, and I(2)−I(1)=G1+IR(T)+G2−(G1+IR(T))=G2. Thus, only the visible light images R2, B2, and G2 remain. Accordingly, the visible light image may be obtained from I(2)−I(1).

An infrared image may be, for example, calculated by removing the visible light image from a first image I(1). Assuming that A(T) refers to the images R1, B1, and G1 of red, blue, and green light that passes through the color filter 20, travels toward the photoelectric conversion cell array 30, and is absorbed and detected by the photoelectric conversion cell array 30, and that A(R) refers to the images R2, B2, and G2 of red, blue, and green light that is reflected by the reflective modulator 50 when the voltage is applied to the reflective modulator 50, travels toward the photoelectric conversion cell array 30, and is absorbed and detected by the photoelectric conversion cell array 30, then, I(1)=A(T)+R(T), I(2)=A(T)+R(T)+A(R), and I(2)−I(1)=A(T)+R(T)+A(R)−(A(T)+R(T))=A(R).

According to the previous exemplary embodiment, k=IR(T)/IR(R) may be obtained when the infrared light reflectivity of the reflective modulator 50 changes when the applied voltage is turned on and off. By using the same method used to obtain the visible light image, k=A(T)/A(R) regarding the image sensor 10 is obtained, and the infrared image may be obtained by using I(1)−(I(2)−I(1))*k. That is, since I(1)=A(T)+IR(T) and I(2)=A(T)+IR(T)+A(R), I(1)−(I(2)−I(1))*k=I(1)−A(R)*k=I(1)−A(R)*A(T)/A(R)=I(1)−A(T)=IR(T) are satisfied, and thus, only a value of the infrared image remains.

When the visible light reflectivity of the reflective modulator 50 changes according to the applied voltage, the values of k=A(T)/A(R) may be obtained in a calibration process for the image sensor 10. The values of k that are obtained in the calibration process may be stored as, for example, a lookup table. Then, the infrared image IR(T) may be calculated by applying a value of k that matches the visible light image A(R) that is obtained from the first image I(1) and the second image I(2).

As described above, even when the reflective modulator 50 is configured such that a reflectivity of light in the visible wavelength band changes according to the applied voltage, the first image I(1) may be obtained by the image sensor 10 when the voltage is not applied to the reflective modulator 50 and the second image I(2) may be obtained by the image sensor 10 when the voltage is applied to the reflective modulator 50. Then, the visible light images may be obtained by using the second image I(2) and the first image I(1), and the infrared image may be obtained by removing the visible light images from the first image I(1).

As described above, when the reflective modulator 50 is configured such that either an infrared light reflectivity or a visible light reflectivity changes according to the applied voltage, both a visible light image and an infrared image may be obtained by performing capturing twice and then performing signal processing.

Figure 7:
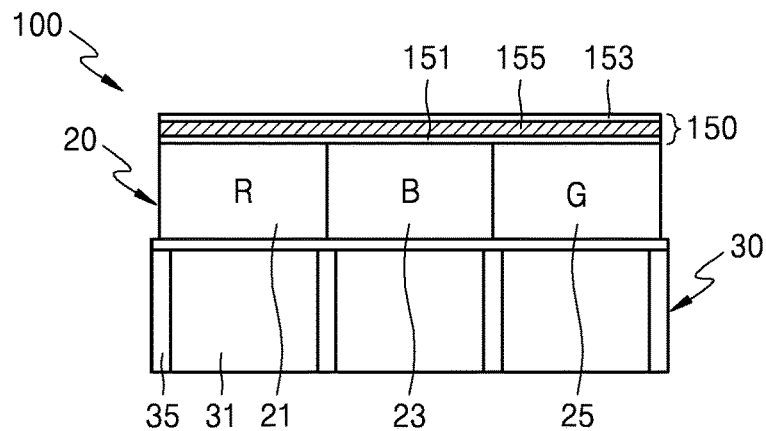
FIG. 7 schematically illustrates an image sensor according to another exemplary embodiment.

An example in which the reflective modulator 50 is disposed below the photoelectric conversion cell array 30 has been described above. As shown in FIG. 7, an image sensor may include a transmissive modulator that is disposed above a photoelectric conversion cell array.

FIG. 7 schematically illustrates an image sensor 100 according to another exemplary embodiment. FIG. 7 illustrates an exemplary embodiment of an image sensor 100 that includes a transmissive modulator 150. Unlike the exemplary embodiment illustrated in FIG. 1, the transmissive modulator 150 of FIG. 7 is located above a photoelectric conversion cell array 30 so that a light transmittance changes according to an applied voltage. FIG. 7 shows an example in which the transmissive modulator 150 is disposed on a color filter 20. As another example, the transmissive modulator 150 may be disposed between the color filter 20 and the photoelectric conversion cell array 30. The transmissive modulator 150 may include an active modulation layer 155 having a light transmittance that is adjustable based on application of a voltage, a first electrode 151 located at a first side of the active modulation layer 155, and a second electrode 153 located at a second side of the active modulation layer 155, opposite the first side. The transmissive modulator 150 may be configured such that a transmittance of light in an infrared wavelength band or a visible wavelength band changes. The image sensor 100 may be used in conjunction with the apparatus of FIG. 4 instead of the image sensor 10. As described above with reference to FIGS. 5A and 5B, the driver 70 of the apparatus may include a power source 71 and a switch 75. The switch 75 may be connected or open so that the voltage is applied or not applied to the transmissive modulator 150.

The transmissive modulator 150 may be configured such that an infrared light transmittance may be turned on or off according to whether the voltage is or is not applied thereto, and visible light may be transmitted regardless of whether or not the voltage is applied. Assuming that IR(T) indicates images of infrared light that passes through the R, B, and G color filter elements 21, 23, and 25 of the color filter 20 and is incident on and detected by the photoelectric conversion cell array 30, and assuming that R, B, and G respectively indicate detected images of red light, blue light, and green light, then, in this case, for example, when the voltage is not applied to the transmissive modulator 150, infrared light may be blocked by the transmissive modulator 150 and thus each of first images I(1) detected by the photoelectric conversion cells 31 (which correspond to the R, B, and G color pixels of the image sensor 100) may be R, B, and G. Therefore, when the voltage is not applied to the transmissive modulator 150, a visible light image may be obtained in the image sensor 100. Although the first images I(1) detected by the photoelectric conversion cells 31 that correspond to the R, B, and G color pixels may be different from each other, since a visible light image is calculated for each of the R, B, and G color pixels, the first images I(1) are indicated by using the same reference numeral for convenience. Since infrared light passes through the transmissive modulator 150 when the voltage is applied to the transmissive modulator 150, second images I(2) detected by the photoelectric conversion cells 31 (which correspond to the R, B, and G color pixels of the image sensor 100) may be respectively referred to as R+IR(T), B+IR(T), and G+IR(T). Since a change in a visible light transmittance of the transmissive modulator 150 is very small when the voltage is applied and not applied thereto, it may be assumed that the visible light transmittance does not change. Although the infrared images IR(T) of the second image I(2), detected by the photoelectric conversion cells 31 that correspond to the R, B, and G color pixels, may be different from each other, since an infrared image and a visible light image are calculated for each of the R, B, and G color pixels of the image sensor 100, the infrared images IR(T) are indicated by using a single reference numeral for convenience. The infrared images IR(T) may be obtained by subtracting the first image I(1), obtained when the voltage is not applied to the transmissive modulator 150, from the second image I(2), obtained when the voltage is applied to the transmissive modulator 150. That is, images detected by the photoelectric conversion cells 31 satisfy: I(2)−I(1)=R+IR(T)−R=IR(T), I(2)−I(1)=B+IR(T)−B=IR(T), and I(2)−I(1)=G+IR(T)−G=IR(T). Thus, only the infrared image IR(T) remains. Accordingly, the infrared image may be obtained from I(2)−I(1). In some exemplary embodiments, the image sensor 100 may be provided such that infrared light is blocked when the voltage is applied to the transmissive modulator 150 and passes through when the voltage is not applied to the transmissive modulator 150. Since processes of calculating a visible light image and an infrared image in these exemplary embodiments may be understood based on the description above, detailed descriptions of the processes will not be repeated.

As another example, the transmissive modulator 150 may be configured such that a visible light transmittance may be turned on or off according to whether the voltage is or is not applied thereto and infrared light may be transmitted regardless of whether or not the voltage is applied. Assuming that IR(T) indicates images of infrared light that passes through the R, B, and G color filter elements 21, 23, and 25 of the color filter 20 and is incident on and detected by the photoelectric conversion cell array 30, and assuming that R, B, and G respectively indicate detected images of red light, blue light, and green light, then, in this case, for example, when the voltage is not applied to the transmissive modulator 150, visible light may be blocked by the transmissive modulator 150 and thus first images I(1) that are detected by the photoelectric conversion cells 31 (which correspond to the R, B, and G color pixels of the image sensor 100) may satisfy I(1)=IR(T). Therefore, when the voltage is not applied to the transmissive modulator 150, an infrared image may be obtained in the image sensor 100. Alternatively, since the visible light passes through the transmissive modulator 150 when the voltage is applied to the transmissive modulator 150, second images I(2) detected by the photoelectric conversion cells 31 (which correspond to the R, B, and G color pixels of the image sensor 100) may be respectively referred to as R+IR(T), B+IR(T), and G+IR(T). Since a change in the infrared light transmittance of the transmissive modulator 150 is very small between when the voltage is applied and not applied thereto, it may be regarded that the infrared light transmittance does not change. Although infrared images IR(T) of the second image I(2) detected by the photoelectric conversion cells 31 that correspond to the R, B, and G color pixels may be different from each other, since an infrared image and a visible light image are calculated for each of the R, B, and G color pixels of the image sensor 100, the infrared images IR(T) are indicated by using a single reference numeral for convenience. The visible light image may be obtained by subtracting the first image I(1), obtained when the voltage is not applied to the transmissive modulator 150, from the second image I(2), obtained when the voltage is applied to the transmissive modulator 150. That is, images detected by the photoelectric conversion cells 31 satisfy: I(2)−I(1)=R+IR(T)−IR(T)=R, I(2)−I(1)=B+IR(T)−IR(T)=B, and I(2)−I(1)=G+IR(T)−IR(T)=G. Thus, only the visible light images R, B, and G remain. Accordingly, the visible light images may be obtained from I(2)−I(1). In some exemplary embodiments, the image sensor 100 may be configured such that visible light is blocked when the voltage is applied to the transmissive modulator 150 voltage and passes through when the voltage is not applied to the transmissive modulator 150. Since processes of calculating a visible light image and an infrared image in these exemplary embodiments may be understood based on the description above, detailed descriptions of the processes will not be repeated.

In order to obtain an image by using the image sensor 10 or 100 according to the exemplary embodiments described above, a first image I(1) is obtained by the image sensor 10 or 100 when a voltage is not applied to a modulator, i.e., the reflective modulator 50 or the transmissive modulator 150, and a second image I(2) is obtained by the image sensor 10 or 100 when the voltage is applied to the modulator. Then, by using the second image I(2) and the first image I(1), any one image selected from an infrared image and a visible light image may be obtained. Also, by removing the any one image from the first image I(1), the other image may be obtained.

The any one image may be obtained by using a difference between the second image I(2) and the first image I(1).

When the any one image is an infrared image and the other image is a visible light image, IR(T) indicates images of infrared light that passes through the color filter 20, travels toward the photoelectric conversion cell array 30, and is absorbed and detected by the photoelectric conversion cell array 30, and IR(R) indicates images of infrared light that is reflected by the reflective modulator 50, travels toward the photoelectric conversion cell array 30, and is absorbed and detected by the photoelectric conversion cell array 30, then, values of k=IR(T)/IR(R) may be obtained, and the visible light image may be obtained by using I(1)−(I(2)−I(1))*k.

When the any one image is a visible light image and the other image is an infrared image, A(T) indicates images of visible light that passes through the color filter 20, travels toward the photoelectric conversion cell array 30, and is absorbed and detected by the photoelectric conversion cell array 30, and A(R) indicates images of visible light that is reflected by the reflective modulator 50, travels toward the photoelectric conversion cell array 30, and is absorbed and detected by the photoelectric conversion cell array 30, then, values of k=A(T)/A(R) may be obtained, and the infrared image may be obtained by using I(1)−(I(2)−I(1))*k.

Figure 8:
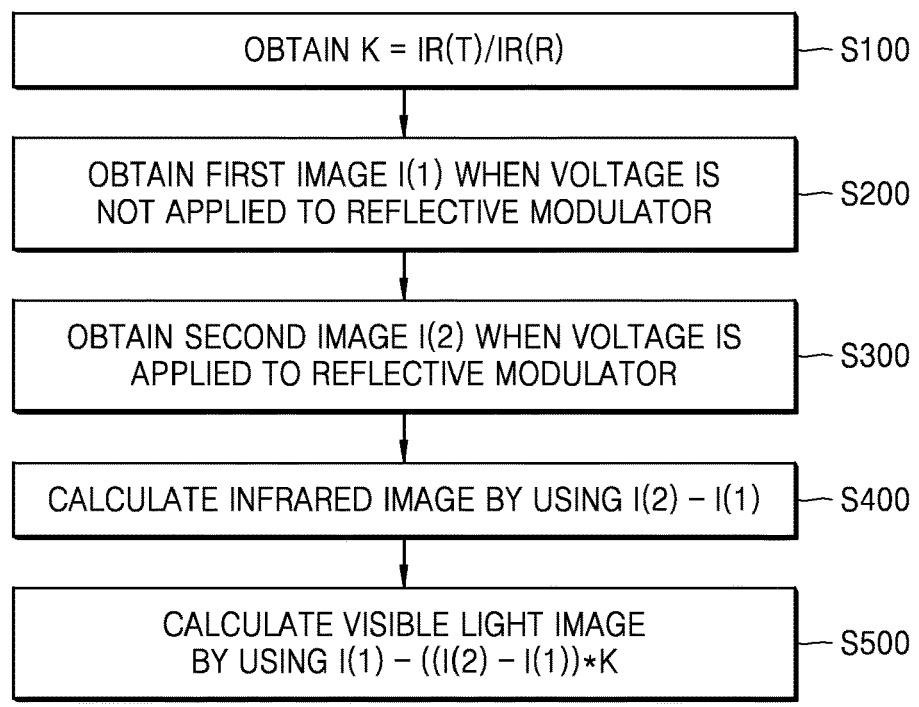
FIG. 8 is a flowchart illustrating a method of acquiring an image according to an exemplary embodiment.

FIG. 8 is a flowchart illustrating a method of acquiring an image according to an exemplary embodiment. For example, the method of FIG. 8 may be performed by using the image sensor 10 of FIG. 1 and the reflective modulator 50 that is disposed in the lower portion of the photoelectric conversion cell array 30 and has an infrared light reflectivity that changes according to the applied voltage.

In order to obtain a visible light image and an infrared image by using the image sensor 10, first, values of k=IR(T)/IR(R) are obtained (S100). As described above, the values of k are calculated in the calibration process for the image sensor 10 and may be stored as, for example, a lookup table.

A first image I(1) is obtained by using the image sensor 10 when the voltage is not applied to the reflective modulator 50 (S200). A second image I(2) is obtained by using the image sensor 10 when the voltage is applied to the reflective modulator 50 (S300). The order of obtaining the first image I(1) and the second image I(2) may be changed.

An infrared image is calculated by using the first image I(1) and the second image I(2) obtained in S200 and S300 (S400). The infrared image may be obtained as IR(R) by calculating I(2)−I(1).

A visible light image may be obtained by removing the infrared image from the first image I(1). For example, the visible light image may be calculated by using the first image I(1), the second image I(2), and the values of k (S500). For example, the visible light image may be obtained by using I(1)−(I(2)−I(1))*k. That is, I(1)−(I(2)−I(1))*k=I(1)−IR(R)*k=I(1)−IR(R)*IR(T)/IR(R)=I(1)−IR(T), and since the first image I(1) is obtained by adding a visible light image of each color and the infrared image IR(T), only the visible light image remains by subtracting IR(T) from I(1). Accordingly, by using the values of k that match the infrared image IR(R) that is obtained from the first image I(1) and the second image I(2), the visible light (R, B, and G) images of the R, B, and G color pixels of the image sensor 10 may be calculated.

When a visible light reflectivity of the reflective modulator 50 changes according to the applied voltage, as described with reference to FIGS. 6A and 6B, values of k=A(T)/A(R) regarding the image sensor 10 may be obtained in operation S100, the visible light image may be calculated by using I(2)−I(1) in operation S400, and the infrared image may be calculated by using I(1)−(I(2)−I(1))*k in operation S500.

Also, when the transmissive modulator 150 is disposed in the upper portion of the photoelectric conversion cell array 30 instead of the reflective modulator 50 and is configured such that the infrared light transmittance is turned on or off according to whether the voltage is or is not applied thereto and visible light is transmitted regardless of whether or not the voltage is applied, operations S100 and S500 may be omitted. Also, a visible light image may be obtained from the first image I(1) obtained when the voltage is not applied to the transmissive modulator 150, and an infrared image may be obtained by subtracting the first image I(1) from the second image I(2) obtained when the voltage is applied to the transmissive modulator 150 in operation S400.

Alternatively, when the transmissive modulator 150 is configured such that the visible light transmittance is turned on or off according to whether the voltage is or is not applied thereto and such that infrared light is transmitted regardless of whether or not the voltage is applied, operations S100 and S500 may be omitted. Also, an infrared image may be obtained from the first image I(1) obtained when the voltage is not applied to the transmissive modulator 150, and a visible light image may be obtained by subtracting the first image I(1) from the second image I(2) obtained when the voltage is applied to the transmissive modulator 150 in operation S400

As described above, according to the one or more of the above exemplary embodiments, since infrared image sensing pixels are not additionally used in the image sensor 10 or 100 and the apparatus and method of acquiring an image by using the image sensor 10 or 100, resolution and sensitivity of a visible light image and resolution of an infrared image may not be decreased. Also, it is not necessary to use an additional infrared light elimination filter to detect the visible light image, and it is not necessary to use a visible light filter that may transmit infrared light in order to detect an infrared image.

What is claimed is:

1. An image sensor comprising:
a color filter comprising an array of a plurality of color filter elements, wherein each of the plurality of color filter elements transmits visible light in a certain wavelength band, and blocks visible light outside the certain wavelength band;
a photoelectric conversion cell array that detects light that has been transmitted through the color filter; and
a reflective modulator, disposed on the photoelectric conversion cell array, wherein the reflective modulator comprises an active modulation layer comprising a material having a reflectivity that is adjustable by application of a voltage thereto;
wherein the reflective modulator is disposed on a lower side of the photoelectric conversion cell array, and
wherein the color filter is disposed on an upper side of the photoelectric conversion cell array, opposite the lower side.

2. The image sensor of claim 1, wherein the reflective modulator further comprises:
a first electrode disposed on one side of the active modulation layer; and
a second electrode disposed on a second side of the active modulation layer.

3. The image sensor of claim 2, wherein the active modulation layer is configured such that a reflectivity of light in an infrared wavelength band changes according to the applied voltage.

4. The image sensor of claim 3, wherein the active modulation layer is configured such that a reflectivity of light in a visible wavelength band is 10% or less.

5. The image sensor of claim 2, wherein the active modulation layer comprises a chalcogenide material.

6. The image sensor of claim 2, wherein the active modulation layer comprises a dielectric thin film layer and a layer that has properties that change according to the voltage.

7. The image sensor of claim 2, wherein the active modulation layer is configured such that a reflectivity of light in a visible wavelength band changes according to the applied voltage.

8. The image sensor of claim 1, wherein the photoelectric conversion cell array comprises a photoelectric conversion layer, and
each of a plurality of photoelectric conversion cells of the photoelectric conversion cell array is separated from adjacent photoelectric conversion cells by a trench formed in the photoelectric conversion layer.

* * * * *